(12) United States Patent
Mao et al.

(10) Patent No.: US 11,353,509 B2
(45) Date of Patent: Jun. 7, 2022

(54) DIGITAL CIRCUIT ROBUSTNESS VERIFICATION METHOD AND SYSTEM

(71) Applicant: Realtek Semiconductor Corporation, Hsinchu (TW)

(72) Inventors: Wen-Yi Mao, Suzhou (CN); Jin-Fu Huang, Suzhou (CN); Dai-De Wei, Suzhou (CN); Yong-Bin Cao, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 59 days.

(21) Appl. No.: 17/001,782

(22) Filed: Aug. 25, 2020

(65) Prior Publication Data

US 2021/0072314 A1 Mar. 11, 2021

(30) Foreign Application Priority Data

Sep. 9, 2019 (CN) .......................... 201910848416.1

(51) Int. Cl.
*G01R 31/26* (2020.01)
*G01R 31/319* (2006.01)
*G01R 31/3183* (2006.01)
*G01R 31/317* (2006.01)

(52) U.S. Cl.
CPC . *G01R 31/31908* (2013.01); *G01R 31/31701* (2013.01); *G01R 31/31704* (2013.01); *G01R 31/31726* (2013.01); *G01R 31/31835* (2013.01); *G01R 31/31926* (2013.01)

(58) Field of Classification Search
CPC ........ G01R 31/31701; G01R 31/31704; G01R 31/31707; G01R 31/31726; G01R 31/31905; G01R 31/31908; G01R 31/31926; G01R 31/31835; G01R 31/318335; G01R 31/318522;
(Continued)

(56) References Cited

U.S. PATENT DOCUMENTS 10,621,076 B2 * 4/2020 Xu ...................... G06F 11/2221
2006/0031725 A1 * 2/2006 Kang ............... G01R 31/31813
714/718

(Continued)

FOREIGN PATENT DOCUMENTS

TW 200951465 A 12/2009
TW I472918 B 2/2015

*Primary Examiner* — Thang X Le
(74) *Attorney, Agent, or Firm* — Locke Lord LLP; Tim Tingkang Xia, Esq.

(57) ABSTRACT

A digital circuit robustness verification method is provided that includes the following steps. An internal storage circuit and an external storage circuit corresponding to a circuit under test are set to store a plurality of random values and a configuration of the circuit under test for performing a predetermined function is set by a processing circuit. A driving signal corresponding to the predetermined function is transmitted to the circuit under test by a previous stage circuit, such that the circuit under test executes the predetermined function to further generate an output signal. The determination as to whether the output signal is correct or not is made by a next stage circuit, and the circuit under test is determined to pass a robustness verification when the output signal is correct.

17 Claims, 2 Drawing Sheets

(58) Field of Classification Search
CPC .... G01R 31/318538; G01R 31/318583; G01R 31/318533; G01R 31/318555
See application file for complete search history.

(56) References Cited

U.S. PATENT DOCUMENTS

| | | | | |
|---|---|---|---|---|
| 2010/0102840 | A1* | 4/2010 | Ueda | G01R 31/31905 324/756.01 |
| 2011/0258499 | A1* | 10/2011 | Casarsa | G01R 31/31724 714/726 |
| 2014/0195870 | A1* | 7/2014 | Ma | G11C 29/56 714/735 |
| 2017/0286197 | A1* | 10/2017 | Halbert | G11C 29/02 |
| 2018/0024192 | A1* | 1/2018 | Sinha | G01R 31/31703 714/738 |

* cited by examiner

200

201: setting the internal storage circuit and the external storage circuit corresponding to the circuit under test to store a plurality of random values by the processing circuit, and setting a configuration of the circuit under test for performing the predetermined function by the processing circuit 202: transmitting the driving signal corresponding to the predetermined function to the circuit under test by the previous stage circuit, such that the circuit under test performs the predetermined function to further generate the output signal 203: whether the output signal is correct or not?

No → 204: determining that the circuit under test does not pass the robustness verification Yes → 205: determining that the circuit under test passes the robustness verification

Fig. 2

DIGITAL CIRCUIT ROBUSTNESS VERIFICATION METHOD AND SYSTEM

CROSS-REFERENCE TO RELATED APPLICATION

This application claims priority to China Application Serial Number 201910848416.1, filed Sep. 9, 2019, which is herein incorporated by reference in its entirety.

BACKGROUND

Technical Field

The present disclosure relates to a verification technique, and more particularly, to a digital circuit robustness verification method and system.

Description of Related Art

A digital circuit is a complex circuit composed of many logic gates. Compared with an analog circuit, a digital circuit mainly processes digital signals and has stronger anti-interference capability. Common digital circuits include various gate circuits, flip-flops, and various combinational logic circuits and sequential logic circuits composed thereof.

In operation, the digital circuit may have an error condition, which may cause the storage component related thereto to generate incorrect data. When the digital circuit has the ability to resume normal operation itself from an error state, it has a higher robustness. Under the condition that the capability of recovery of the digital circuit is unknown, the robustness thereof cannot be evaluated.

Therefore, how to design a new digital circuit robustness verification method and system to solve the above-mentioned deficiencies is an urgent problem to be solved in this industry.

SUMMARY

The summary aims at providing a simplified summary of the present disclosure, so that the reader has a basic understanding of the present disclosure. This summary is not a complete overview of the disclosure, and it is not intended to point out important/critical elements of embodiments of the present disclosure or define the scope of the present disclosure.

An object of the present disclosure is to provide a digital circuit robustness verification method and system to improve the problems of the prior art.

In order to achieve the aforementioned object, one aspect of the present disclosure is to provide a digital circuit robustness verification method, which is applied to a digital circuit robustness verification system, including the following steps. An internal storage circuit and an external storage circuit corresponding to a circuit under test are set to store a plurality of random values and a configuration of the circuit under test for performing a predetermined function is set by a processing circuit. A driving signal corresponding to the predetermined function is transmitted to the circuit under test by a previous stage circuit, such that the circuit under test performs the predetermined function to further generate an output signal. The determination as to whether the output signal is correct or not is made by a next stage circuit, so that the circuit under test is determined to pass a robustness verification when the output signal is correct.

Another aspect of the present disclosure is to provide a digital circuit robustness verification system that includes a processing circuit, a previous stage circuit, and a next stage circuit. The processing circuit is configured to set an internal storage circuit and an external storage circuit corresponding to a circuit under test to store a plurality of random values, and to set a configuration of the circuit under test for performing a predetermined function. The previous stage circuit is configured to transmit a driving signal corresponding to the predetermined function to the circuit under test, so that the circuit under test performs the predetermined function to further generate an output signal. The next stage circuit is configured to determine whether the output signal is correct or not, and to determine that the circuit under test passes a robustness verification when the output signal is correct.

The digital circuit robustness verification method and system of the present disclosure can perform the robustness verification on the circuit under test to ensure that the circuit under test can resume normal operation itself to generate the correct output signal when an error is occurred.

BRIEF DESCRIPTION OF THE DRAWINGS

The present disclosure can be more fully understood by reading the following detailed description of the embodiment, with reference made to the accompanying drawings as follows:

FIG. 2 is a flowchart of a digital circuit robustness verification method according to an embodiment of the present disclosure.

DETAILED DESCRIPTION

Figure 1:
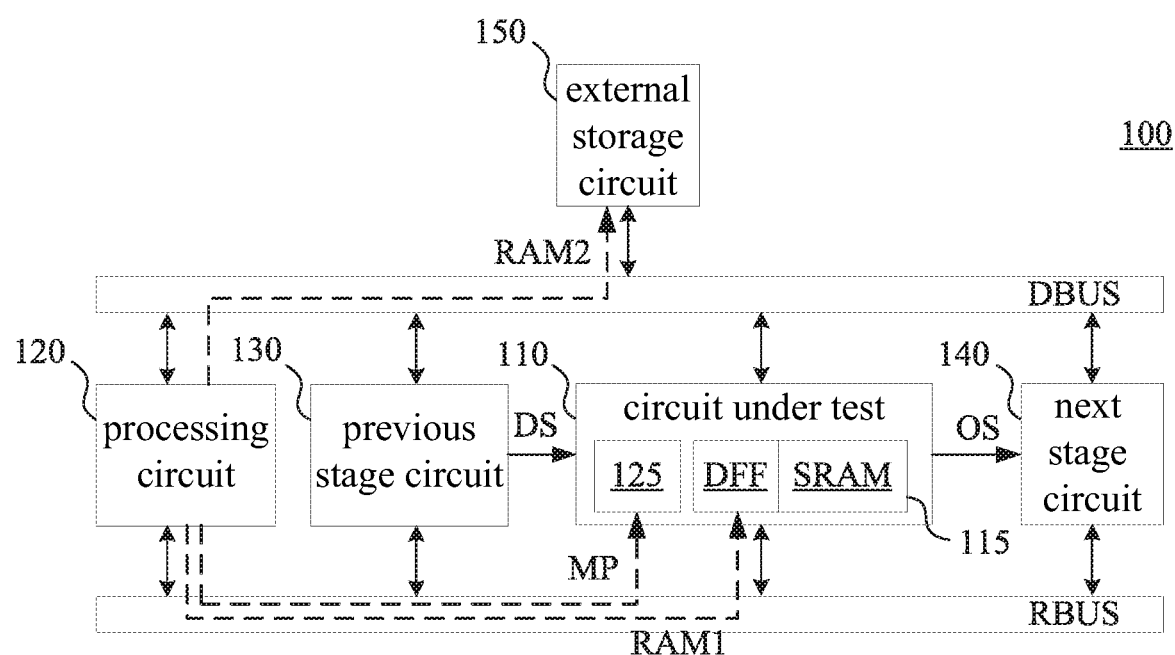
FIG. 1 is a block diagram of a digital circuit robustness verification system according to an embodiment of the present disclosure.

Reference is made to FIG. 1. FIG. 1 is a block diagram of a digital circuit robustness verification system 100 according to an embodiment of the present disclosure. The digital circuit robustness verification system 100 is configured to perform a verification procedure of the robustness on a circuit under test 110 designed with the digital circuit, in order to determine whether the circuit under test 110 is able to resume its normal operation from an error state or not.

The digital circuit robustness verification system 100 includes a processing circuit 120, a previous stage circuit 130, and a next stage circuit 140.

Before performing the verification procedure, the processing circuit 120 is configured to perform a clock reset on the digital circuit robustness verification system 100, and to set each circuit module, such as the previous stage circuit 130 and the next stage circuit 140.

In an embodiment, the processing circuit 120 can set the aforementioned circuits through a bus RBUS with a low bandwidth and a relatively low speed, such as an advanced peripheral bus (APB). Furthermore, in an embodiment, the processing circuit 120 writes the relevant parameters into a mode register (not shown) of each circuit module to complete the setting, so that the previous stage circuit 130 and the next stage circuit 140 perform the operations corresponding to the setting during the verification procedure.

The processing circuit 120 is further configured to set an internal storage circuit 115 and an external storage circuit 150 corresponding to the circuit under test 110 to store a plurality of random values RAM1 and RAM2.

In an embodiment, the internal storage circuit 115 corresponding to the circuit under test 110 may include, for example, but not limited to, a flip-flop DFF and a static random access memory SRAM, in which the flip-flop DFF may include multiple flip-flop units. The internal storage circuit 115 is disposed inside the circuit under test 110 to provide a temporary storage function when the circuit under test 110 operates. In an embodiment, the processing circuit 120 can set the internal storage circuit 115 to store the random value RAM1 through the bus RBUS.

In an embodiment, the external storage circuit 150 corresponding to the circuit under test 110 is a double data rate synchronous dynamic random access memory outside the circuit under test 110. The external storage circuit 150 is disposed outside the circuit under test 110 to provide a data access function when the circuit under test 110 operates.

In an embodiment, the circuit under test 110 can access external storage circuit 150 through a bus DBUS with a high bandwidth and a relatively high speed, such as an advanced high-performance bus (AHB), when it operates. In an embodiment, the processing circuit 120 can also set the external storage circuit 150 to store the random value RAM2 through the bus DBUS.

By setting the internal storage circuit 115 and the external storage circuit 150 to store the random values RAM1 and RAM2 as described above, the processing circuit 120 can simulate a situation of data error resulted from the abnormality of the circuit under test 110. In the aforementioned situation, since the internal storage circuit 115 and the external storage circuit 150 are set to store the random values RAM1 and RAM2, the circuit under test 110 is expected to cause an error.

Next, the processing circuit 120 sets a configuration of the circuit under test 110 for performing a predetermined function. In an embodiment, the processing circuit 120 may also set the circuit under test 110 through the bus RBUS. Moreover, the circuit under test 110 may include a mode register 125, so that the processing circuit 120 writes a mode setting parameter MP corresponding to the predetermined function into the mode register 125 through the bus RBUS. The circuit under test 110 is going to read the mode setting parameter MP of the mode register 125 to perform the predetermined function in the verification procedure.

In an embodiment, the circuit under test 110 can perform the predetermined function without the requirement for the predetermined data. In another embodiment, the circuit under test 110 needs the predetermined data to perform the predetermined function. Under such condition, the processing circuit 120 initializes the predetermined data, which is required by the circuit under test 110 for performing the predetermined function, in which the predetermined data is stored in a certain block of the internal storage circuit 115 and/or the external storage circuit 150. During the initialization, the processing circuit 120 sets the internal storage circuit 115 and the external storage circuit 150 to store the correct initialization data required by the circuit under test 110.

The previous stage circuit 130 is configured to transmit a driving signal DS corresponding to the predetermined function to the circuit under test 110, so that the circuit under test 110 executes the predetermined function to further generate an output signal OS. After receiving the driving signal DS, the circuit under test 110 reads the mode setting parameter MP of the mode register 125 and executes the predetermined function to perform the data processing and the calculation correspondingly to generate the output signal OS.

The next stage circuit 140 is configured to determine whether the output signal OS is correct or not, and to determine that the circuit under test 110 passes the robustness verification when the output signal OS is correct. In more detail, when the output signal OS is correct, it means that the circuit under test 110 can recover from an error state corresponding to this set of random values, successfully perform the subsequent predetermined function, and generate the correct output signal OS.

In an embodiment, the next stage circuit 140 performs a cyclic redundancy check (CRC) on the output signal OS to determine whether the output signal OS is correct or not. Moreover, in an embodiment, the next stage circuit 140 can be electrically coupled to the circuit under test 110 through at least one other circuit, and these circuits can process the output signal OS. The next stage circuit 140 receives the processed output signal OS through these circuits and then makes the determination. In another embodiment, the next stage circuit 140 may return the output signal OS to the processing circuit 120, and the determination as to whether the output signal OS is correct or not is made by the processing circuit 120 such that the circuit under test 110 is determined to pass the robustness verification when the output signal OS is correct.

Therefore, the digital circuit robustness verification system 100 of the present disclosure can verify the robustness of the circuit under test 110 to ensure that the circuit under test 110 can resume normal operation itself to generate the correct output signal OS when an error is occurred.

In an embodiment, the processing circuit 120 may perform multiple verifications. The processing circuit sets the internal storage circuit 115 and the external storage circuit 150 to store a different set of random values each time, and performs multiple verifications so as to reach a predetermined test coverage to improve the accuracy of the verification.

Further, in an embodiment, the digital circuit robustness verification system 100 can be implemented by a system on chip (SoC), such that the processing circuit 120, the previous stage circuit 130, and the next stage circuit 140 included therein can be implemented in the way of hardware circuit.

In another embodiment, the circuit under test 110 can be a register transfer level (RTL) model. The digital circuit robustness verification system 100 can be simulated by a test bench, such that the processing circuit 120, the previous stage circuit 130, and the next stage circuit 140 included therein are implemented in the way of, for example, but not limited to, using the processing circuit (hardware) to process the circuit module (software), to verify the circuit under test 110.

FIG. 2 is a flowchart of a digital circuit robustness verification method 200 according to an embodiment of the present disclosure.

The digital circuit robustness verification method 200 can be applied to the digital circuit robustness verification system 100 shown in FIG. 1. The digital circuit robustness verification method 200 includes the following operations (it should be understood that the operations mentioned in the present embodiment, except for those whose sequences are specifically described, can be adjusted according to actual needs, and can even be executed simultaneously or partly simultaneously.

In operation 201, the internal storage circuit 115 and the external storage circuit 150 corresponding to the circuit under test 110 are set to store a plurality of random values and a configuration of the circuit under test 110 for performing the predetermined function is set by the processing circuit 120.

In an embodiment, before the processing circuit 120 sets the circuit under test 110, the internal storage circuit 115 and the external storage circuit 150 corresponding thereto, the processing circuit 120 may also perform a clock reset on the digital circuit robustness verification system 100, and set other circuits of the digital circuit robustness verification system 100, such as, but not limited to, the previous stage circuit 130 and the next stage circuit 140.

In operation 202, the driving signal DS corresponding to the predetermined function is transmitted to the circuit under test 110 by the previous stage circuit 130, such that the circuit under test 110 performs the predetermined function to further generate the output signal OS.

In operation 203, the determination as to whether the output signal OS is correct or not is made by the next stage circuit 140.

In operation 204, when the output signal OS is incorrect, it is determined that the circuit under test 110 does not pass the robustness verification.

In operation 205, when the output signal OS is correct, it is determined that the circuit under test 110 passes the robustness verification.

Although the present disclosure has been described in considerable detail with reference to certain embodiments thereof, other embodiments are possible. It will be apparent to those skilled in the art that various modifications and variations can be made to the structure of the present disclosure without departing from the scope or spirit of the disclosure. Therefore, the spirit and scope of the appended claims should not be limited to the description of the embodiments contained herein.

What is claimed is:

1. A digital circuit robustness verification method applied to a digital circuit robustness verification system, the method comprising:
    setting an internal storage circuit and an external storage circuit corresponding to a circuit under test to store a plurality of random values for a processing circuit to simulate a situation of data error resulted from an abnormality of the circuit under test and setting a configuration of the circuit under test for performing a predetermined function by the processing circuit;
    transmitting a driving signal corresponding to the predetermined function to the circuit under test by a previous stage circuit, such that the circuit under test performs the predetermined function to further generate an output signal; and
    determining whether the output signal is correct or not by a next stage circuit, and determining that the circuit under test recovers from the situation and passes a robustness verification when the output signal is correct.

2. The digital circuit robustness verification method of claim 1, wherein the internal storage circuit corresponding to the circuit under test comprises at least one of a flip-flop or a static random access memory.

3. The digital circuit robustness verification method of claim 1, wherein the external storage circuit corresponding to the circuit under test is a double data rate synchronous dynamic random access memory outside the circuit under test.

4. The digital circuit robustness verification method of claim 1, further comprising:
    writing a mode setting parameter into a mode register of the circuit under test by the processing circuit, so as to set the configuration of the circuit under test for performing the predetermined function.

5. The digital circuit robustness verification method of claim 1, further comprising:
    further initializing a predetermined data required by the circuit under test for performing the predetermined function by the processing circuit, wherein the predetermined data is stored in the internal storage circuit and/or the external storage circuit.

6. The digital circuit robustness verification method of claim 1, further comprising:
    performing a cyclic redundancy check (CRC) on the output signal by the next stage circuit, so as to determine whether the output signal is correct or not.

7. The digital circuit robustness verification method of claim 1, further comprising:
    before setting the circuit under test, performing a clock reset and setting the previous stage circuit and the next stage circuit by the processing circuit.

8. The digital circuit robustness verification method of claim 1, further comprising:
    setting the internal storage circuit and the external storage circuit to store different random values to preform a plurality of verifications by the processing circuits so as to reach a predetermined test coverage.

9. A digital circuit robustness verification system, comprising:
    a processing circuit configured to set an internal storage circuit and an external storage circuit corresponding to a circuit under test to store a plurality of random values for the processing circuit to simulate a situation of data error resulted from an abnormality of the circuit under test, and to set a configuration of the circuit under test for performing a predetermined function;
    a previous stage circuit configured to transmit a driving signal corresponding to the predetermined function to the circuit under test, so that the circuit under test performs the predetermined function to further generate an output signal; and
    a next stage circuit configured to determine whether the output signal is correct or not, and to determine that the circuit under test recovers from the situation and passes a robustness verification when the output signal is correct.

10. The digital circuit robustness verification system of claim 9, wherein the processing circuit, the external storage circuit, the previous stage circuit, and the next stage circuit are implemented by a system on a chip (SoC), or simulated by a test bench.

11. The digital circuit robustness verification system of claim 9, wherein the internal storage circuit corresponding to the circuit under test comprises at least one of a flip-flop or a static random access memory.

12. The digital circuit robustness verification system of claim 9, wherein the external storage circuit corresponding to the circuit under test is a double data rate synchronous dynamic random access memory outside the circuit under test.

13. The digital circuit robustness verification system of claim 9, wherein the processing circuit is further configured to write a mode setting parameter into a mode register of the circuit under test, so as to set a configuration of the circuit under test for perform the predetermined function.

14. The digital circuit robustness verification system of claim 9, wherein the processing circuit is further configured to initialize a predetermined data required by the circuit under test for performing the predetermined function, wherein the predetermined data is stored in the internal storage circuit and/or the external storage circuit.

15. The digital circuit robustness verification system of claim 9, wherein the next stage circuit is further configured to perform a cyclic redundancy check on the output signal to determine whether the output signal is correct or not.

16. The digital circuit robustness verification system of claim 9, wherein before setting the circuit under test, the processing circuit is further configured to perform a clock reset, and to set the previous stage circuit and the next stage circuit.

17. The digital circuit robustness verification system of claim 9, wherein the processing circuit is further configured to set the internal storage circuit and the external storage circuit to store different random values to perform a plurality of verifications so as to reach a predetermined test coverage.

* * * * *